United States Patent [19]

Lay

[11] Patent Number: 5,227,991

[45] Date of Patent: Jul. 13, 1993

[54] COMB FILTER INCLUDING A DATA OVERFLOW MONITOR, AND A RADIO INCLUDING THE SAME

[75] Inventor: Robert F. Lay, Elgin, Ill.

[73] Assignee: Motorola, Inc., Schaumburg, Ill.

[21] Appl. No.: 795,922

[22] Filed: Nov. 20, 1991

[51] Int. Cl.[5] .............................................. G06F 15/31
[52] U.S. Cl. .............................................. 364/724.03
[58] Field of Search ................ 364/724.03, 724.01, 364/745

[56] References Cited

U.S. PATENT DOCUMENTS

| | | | |
|---|---|---|---|
| 4,215,415 | 7/1980 | Kanemasa | 364/724.03 |
| 4,223,389 | 9/1980 | Amada et al. | 364/724.03 |
| 4,507,725 | 3/1985 | Christopher et al. | 364/724.03 |
| 5,150,318 | 9/1992 | Kontani et al. | 364/724.03 |

Primary Examiner—David H. Malzahn
Attorney, Agent, or Firm—Wayne J. Egan

[57] ABSTRACT

A monitor (102) is suitable for monitoring the data integrity of a comb filter (101). Generally, the filter will include at least one differencer stage, at least one buffer stage, and at least one integrator stage, including an output integrator stage (500). The output integrator stage will include a most-significant input bit (150) ("I"), a most-significant output bit (130) ("O"), and a carry bit (140) ("C"). In one embodiment, the monitor includes a detector (600) for detecting an overflow condition in the filter based on the equation (inverse C) * (O) * (I)+(C) * (inverse O) * (inverse I). The monitor also includes a waveform generator (700) that, in response to the occurrence of an overflow condition, generates a resetting waveform (170) of a predetermined shape and time duration, that is then coupled to the resetting terminals of all stages in the filter.

36 Claims, 5 Drawing Sheets

COMB FILTER INCLUDING A DATA OVERFLOW MONITOR, AND A RADIO INCLUDING THE SAME

FIELD OF THE INVENTION

This application relates to filters including, but not limited to, digital filters.

BACKGROUND OF THE INVENTION

Signal filters are devices that process an input signal to provide a desired output signal. In the past, such filters have been based on analog components. Modern signal processing, however, has increasingly provided signals in digital form. In such an environment, a signal that is initially analog will be digitally sampled, and thereafter represented by the digital samples themselves. In order to process such signals, digital filters have been designed to operate directly on the digital samples.

A particular kind of digital filter is a comb filter. For a general discussion of comb filters, see Chu, Shuni et al., "Multirate Filter Designs Using Comb Filters," IEEE Transactions on Circuits and Systems, November 1984, pp. 913-924. As discussed therein, such filters have at least one differencer stage, at least one buffer stage, and at least one integrator stage, all connected in series.

As explained in Chu, during the normal operation of such filters, particularly the infinite impulse response ("IIR")-type, the possibility exists for data errors. The source of these errors is primarily noise. Once an error is introduced into the filter, the error will grow without bound, due to the recursive nature of the IIR algorithm. Ultimately, this will cause the stages to reach their maximum values and overflow. As a result, the filter will stop operating.

The foregoing problem becomes acute when such a filter is used in the transmission path of a typical digital radio. In such a radio, for instance, such a filter may be used to interpolate a digital signal prior to a final sigma-delta digital-to-analog ("D/A") converter used to drive a voltage-controlled oscillator ("VCO") in the transmission path. With this arrangement, an overflow of the filter will immediately block the transmission path, thus causing the radio to stop transmitting. The user of the radio experiencing this situation would find the radio transmission unintelligible.

To date there has been no satisfactory solution to this problem.

DETAILED DESCRIPTION

Figure 1:
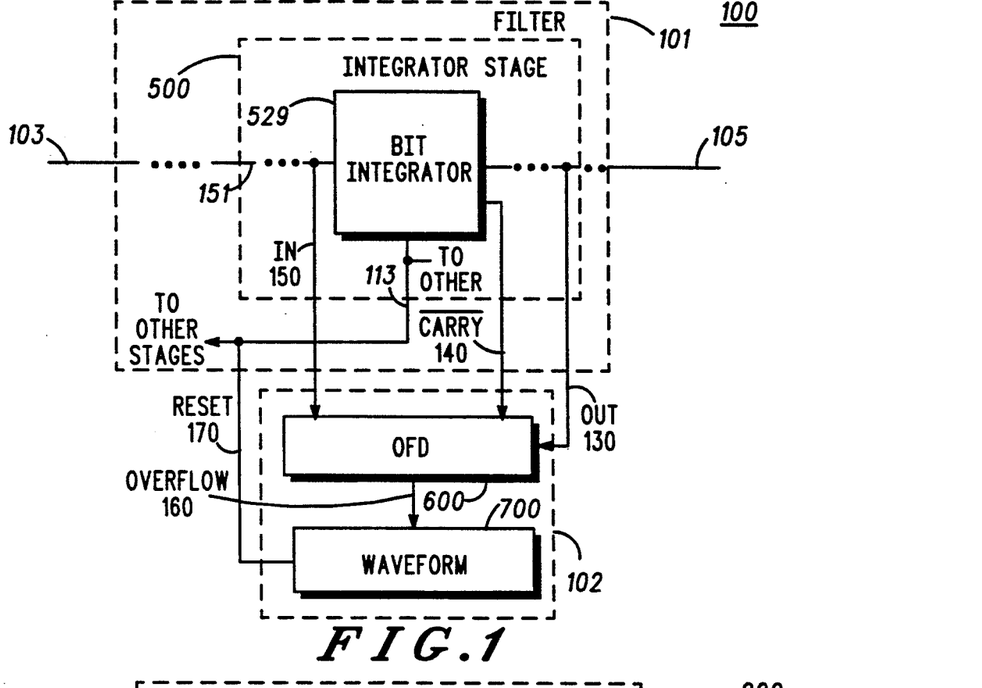
FIG. 1 is a block diagram that shows a first arrangement 100 of a comb filter arranged with a data integrity monitor, according to the invention.

FIG. 1 shows a first embodiment of a data integrity monitor 102 (hereinafter the "monitor"), according to the invention. The monitor 102 is coupled to a comb filter 101 via four leads 130, 140, 150, and 170. The filter 101 is an infinite impulse response filter.

The filter 101 includes an input signal 103. In general, the input 103 will include a plurality of parallel input bits such as, for instance, 16 bits. The filter 101 provides an output signal 105. In general, the output signal 105 will include a plurality of parallel output bits such as, for instance, 19 bits.

In a comb filter such as filter 101, there will be at least one differencer stage, at least one buffer stage, and at least one integrator stage. The filter 101 may have, for instance, three differencer stages, 1 buffer stage, and three integrator stages, connected in series. In this case, the first differencer stage (not shown) is coupled to the filter input 103. The final stage of the series connection of stages is an integrator stage 500, with input designated 151. The series of stages that precede integrator stage 500 is depicted by a broken line.

In the filter 101, stage 500 is the output integrator stage, and its multi-bit output signal forms the output signal 105 for the filter 101. The input to the output integrator stage 500 is the signal 151 that consists of a plurality of parallel bits. Signal 151 may include, for instance, 31 bits.

Each stage, whether differencer, buffer, or integrator, includes a resetting terminal. Applying a signal of sufficient energy and duration to this terminal causes the corresponding filter stage to be reset to an all-zero condition. For instance, the output integrator stage 500 includes a resetting terminal 113.

The output integrator stage 500 will include a multiplicity of individual integrator units for integrating the individual bit signals that make up the composite input signal 151. In particular, the output integrator stage 500 will include an integrator unit for the most-significant input bit 150 of the multi-bit signal 151. This single-bit integrator unit is depicted as element 529. The output of this single-bit integrator unit 529 also forms the most-significant output bit 130 of the output signal 105 for the output integrator stage 500.

The logical complement of the carry bit signal, or the carry complement bit signal, for the single-bit integrator unit 529 is element 140. This signal 140 indicates the mathematical complement of the "carry" result into the integration of the most-significant input bit 150, as is known in the art.

The monitor circuit 102 includes an overflow detector circuit ("OFD") 600, and a waveform generator circuit 700, coupled via lead 160.

The basic function of the overflow detector circuit 600 is to detect an overflow condition in the filter 101 and, when this occurs, to energize the waveform generator circuit 700 via triggering path 160, designated OVERFLOW. The overflow detector circuit 600 detects the overflow condition by monitoring the logical values for the output integrator stage 500's most-significant input bit 150, designated IN or "I"; the most-significant output bit 130, designated OUT or "O"; and the carry complement bit 140, designated CARRY or "inverse C". The overflow detector circuit 600 determines that an overflow condition exists based on the following equation:

(inverse C)*(O)*(I)+(C)*(inverse O)*(inverse I).

The basic function of the waveform generator circuit 700 is, upon being triggered by an enabling signal applied by the overflow detector circuit 600 via path 160, to generate a resetting signal of sufficient level and duration that will cause all stages in the filter 101 to be reset to a zero condition. This signal is coupled to the reset terminals of all differencer, buffer, and integrator stages of filter 101 via lead 170, designated RESET.

The required reset time for a given filter will depend on the amount of time needed for the filter to settle out to a reset state. A typical reset waveform may have a time duration of 2.0 microseconds.

Ideally, the shape of the resetting waveform should be a square wave, with rise time and fall time of sufficient speed to allow reasonable switching of the gates involved. For instance, typical values for an acceptable rise time and fall time would be approximately 5 nanoseconds.

In one embodiment, the filter 101 may have, for instance 3 differencer stages, 1 buffer stage, and 3 integrator stages, with an interpolation ratio of 75, an input rate of 48 KHz, and an output rate of 2.4 MHz. This method is also applicable to other orders of interpolating comb filters and to other interpolation ratios.

It will be apparent that the comb filter 101 may be fabricated, in whole or in part, in a custom integrated circuit. Likewise, the monitor circuit 102, including the overflow detector 600 and the waveform generator 700, may be comprised, in whole or in part, in a custom integrated circuit. In the alternative, the monitor circuit 102 including the overflow detector 600 and the waveform generator 700 may be fabricated, in whole or in part, by standard integrated circuit ("IC") units. In the alternative, the monitor circuit 102, including the overflow detector 600 and the waveform generator 700 may be fabricated, in whole or in part, by a suitably-programmed processor such as, for instance, a Digital Signal Processor ("DSP").

Figure 2:
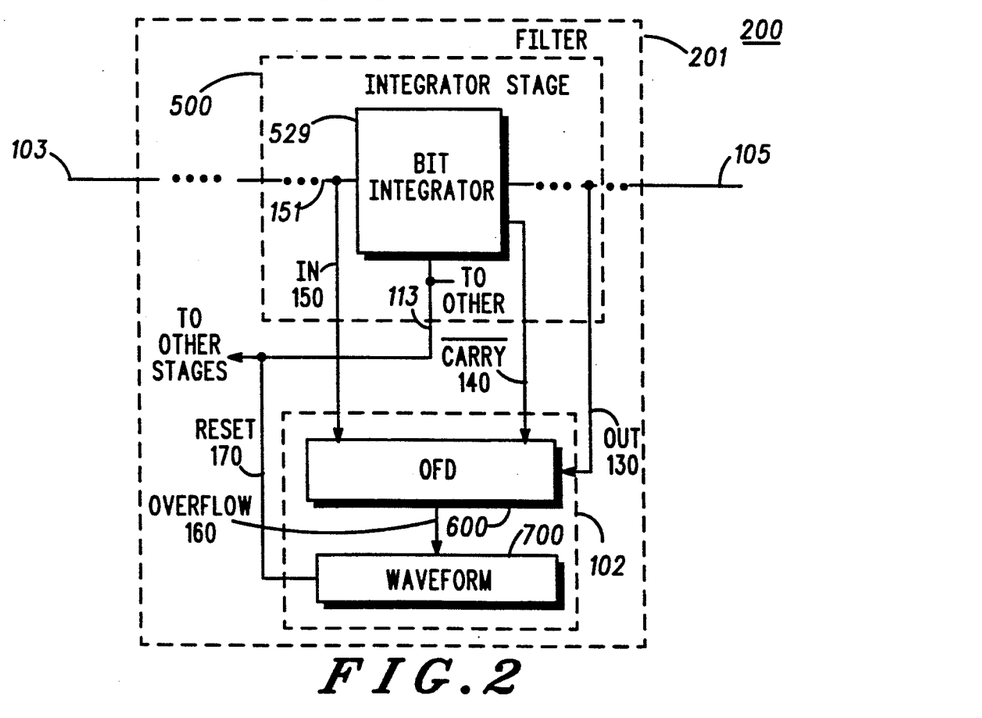
FIG. 2 is a block diagram showing a second arrangement 200 of a comb filter arranged with a data integrity monitor, according to the invention.

FIG. 2 depicts a comb filter 201 that again includes an input 103 and an output 105. The filter 201 is an infinite impulse response filter, and, similar to the filter 101 above, contains at least one differencer stage, at least one buffer stage, and at least one integrator stage, the stages coupled in series. As above, the final stage of the series connection of stages is depicted as integrator stage 500. Stage 500 is the output integrator stage, and its multi-bit output signal forms the output signal 105 for the filter 201. Also as above, each stage includes a resetting terminal, the resetting terminal for output integrator stage 500 depicted as element 113. Also as above, output integrator stage 500 includes a single-bit integrator unit 529 for the most-significant input bit 150 of the input signal 151 and the most-significant output bit 130 of the output signal 105.

The comb filter 201 includes a monitor circuit 102 coupled to the output integrator stage 500's most-significant input bit 150, most-significant output bit 130, and carry complement bit 140, with corresponding logical variables I, O, and inverse C, respectively.

As above, the monitor circuit 102 includes an overflow detector 600 and a waveform generator 700. The overflow detector 600 monitors the logical values I, O, and inverse C, and detects an overflow condition via the logical equation given above. In response to such condition, the detector 600 triggers the waveform circuit 700 via the triggering OVERFLOW path 160. Upon being so triggered, the waveform generator 700 generates a resetting waveform to reset all stages in the filter 201 via the RESET path 170.

Similar to above, the comb filter 201, having an integral monitor circuit 102, may be fabricated in a custom integrated circuit, or by standard IC units, or by a suitably-programmed processor such as a DSP.

Figure 3:
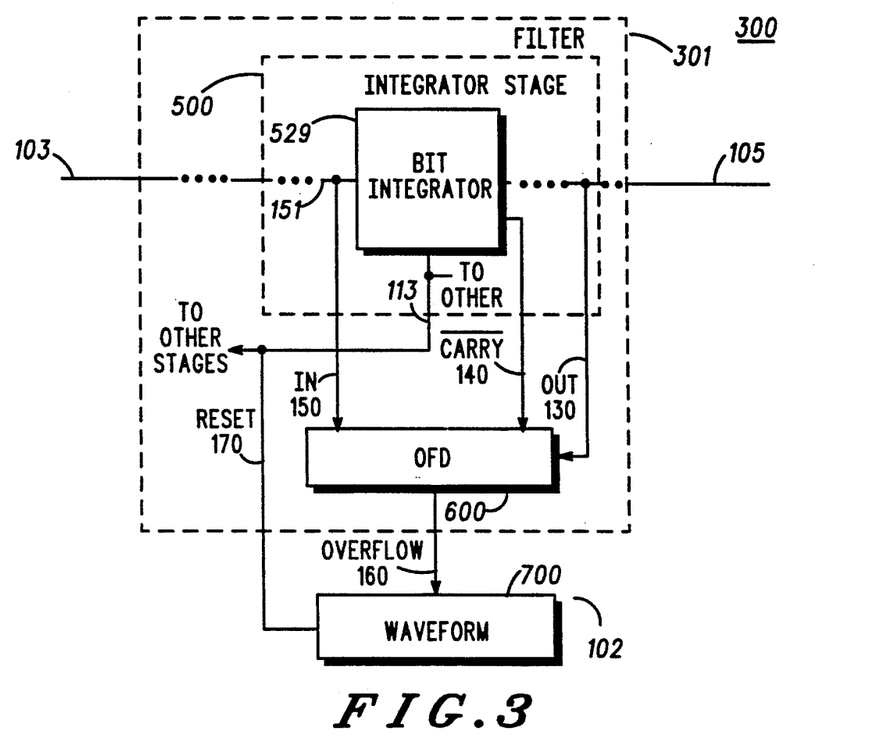
FIG. 3 is a block diagram showing a third arrangement 300 of a comb filter arranged with a data integrity monitor, according to the invention.

FIG. 3 depicts a comb filter 301 that again includes an input 103 and an output 105, and that has an integral overflow detector 600 that couples to a waveform generator circuit 700.

The filter 301 is an infinite impulse response filter, and, similar to the filter 201 above, contains at least one differencer stage, at least one buffer stage, and at least one integrator stage, the stages coupled in series. As above, the final stage of the series connection of stages is depicted as integrator stage 500. Stage 500 is the output integrator stage, and its multi-bit output signal forms the output signal 105 for the filter 301. Also as above, each stage includes a resetting terminal, the resetting terminal for output integrator stage 500 depicted as element 113. Also as above, output integrator stage 500 includes a single-bit integrator unit 529 for the most-significant input bit 150 of the input signal 151 and the most-significant output bit 130 of the output signal 105.

Figure 4:
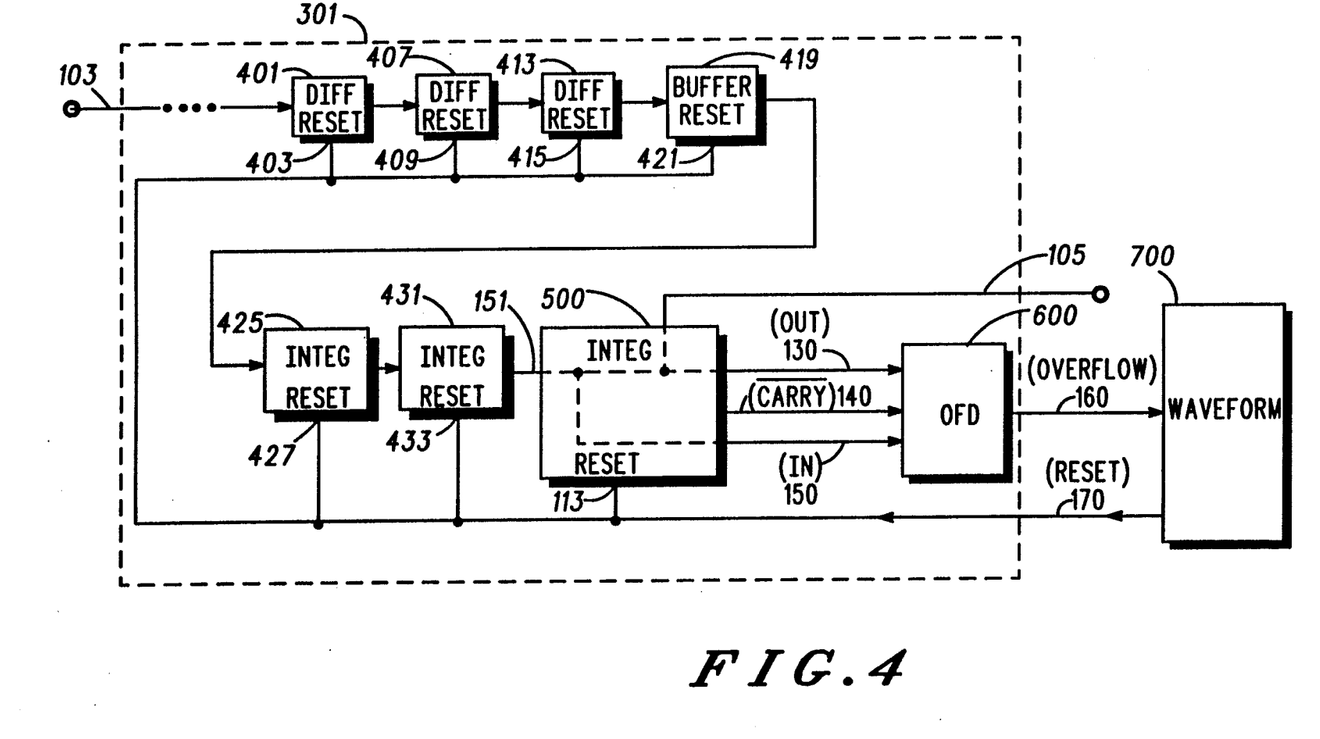
FIG. 4 is a further block diagram showing the third arrangement.

FIG. 4 shows further detail for the comb filter 301 of FIG. 3. The filter 301 includes a first differencer stage 401, a second differencer stage 407, a third differencer stage 413, a buffer stage 419, a first integrator stage 425, a second integrator stage 431, and a third output integrator stage 500. Differencer stages 401, 407, and 413 include reset terminals 403, 409, and 415; buffer stage 419 includes reset terminal 421; and integrator stages 425, 431, and 500 include reset terminals 427, 433, and 113.

The output integrator stage 500 is coupled to the overflow detector 600 via the most-significant output bit 130 of the output signal 105 designated OUT with logical value O, the carry bit 140 designated CARRY with logical value inverse C, and the most-significant input bit 150 of the input signal 151 designated IN with logical value I.

The overflow detector's output 160 designated OVERFLOW drives the waveform generator 700. The waveform generator 700's output 170 designated RESET drives the reset terminals of all stages of filter 301.

In one embodiment, differencer stages 401, 407, 413, buffer stage 419, integrator stages 425, 431, 500, and overflow detector 600 are fabricated as a custom integrated circuit. In the alternative, however, differencer stages 401, 407, and 413 may be fabricated from part numbers MC74HC283 (adder), MC74HC04 (inverter), and MC74HC174 (resettable D-type latch). Also, the buffer stage 419 may be fabricated from part number MC74HC174 (resettable D-type latch). Also, integrator stages 425, 431, and 500 may be fabricated from part numbers MC74HC283 (adder), and MC74HC174 (resettable D-type latch). All parts are available from Motorola, Inc.

The buffer stage 419 may be, for example, a 19-bit latch formed from 1-bit static latches connected in parallel. Further, the differencer stages 401, 407, and 413 may be 17, 18, and 19-bits wide, respectively, and formed from typical IC differencer stages.

The following is a description of operation. A 16-bit input signal is applied to input 103. The processed signal is ultimately applied to output integrator stage 500 as the 31-bit input signal 151. The most-significant bit 150 of the input signal 151 is applied as the signal IN to the overflow detector 600. The output signal from output integrator stage 500 is the 19-bit output signal 105. The most-significant bit 130 of the output signal 105 is applied as the signal OUT to the overflow detector 600. Also, the carry complement bit of output integrator stage 500 is applied as the signal $\overline{\text{CARRY}}$ to the overflow detector 600.

The overflow detect circuit 600 monitors the logical values of the OUT, IN, and $\overline{\text{CARRY}}$ signals as described above to detect an overflow condition in the filter 301. When an overflow condition is detected, detector 600 signals this condition to the reset waveform generator circuit 700 via the energizing lead OVERFLOW (160). Upon receipt of this triggering signal, the waveform generator circuit 700 generates a suitable resetting waveform and couples it via the lead RESET (170) to the reset terminals of all the filter 301 stages, thereby causing all stages to be reset to an all-zero condition, thus eliminating the overflow condition.

The comb filter 301 having the integral overflow detector 600, may be fabricated, in whole or in part, by a custom integrated circuit, or by standard IC units, or by a suitably-programmed processor, such as a DSP. Likewise, the waveform generator 700 may be fabricated, in whole or in part, by a custom integrated circuit, or by standard IC units, or by a suitably-programmed processor, such as a DSP.

Comparing the above embodiments of FIGS. 1-3, it will be apparent that their basic difference is the configuration of the monitor circuit. Thus, in the embodiment of FIG. 1, the monitor's overflow detector circuit 600 and waveform generator circuit 700 are separate from the filter 101; while in the embodiment of FIG. 2, both circuits 600 and 700 are integral to the filter 201; while in the embodiment of FIG. 3, the overflow detector circuit 600 is integral to the filter 301, and the waveform generator circuit 700 is separate. In all disclosed embodiments, however, the elements that individually comprise the output integrator stage 500, the overflow detector 600, and the waveform generator 700, are similar.

Figure 5:
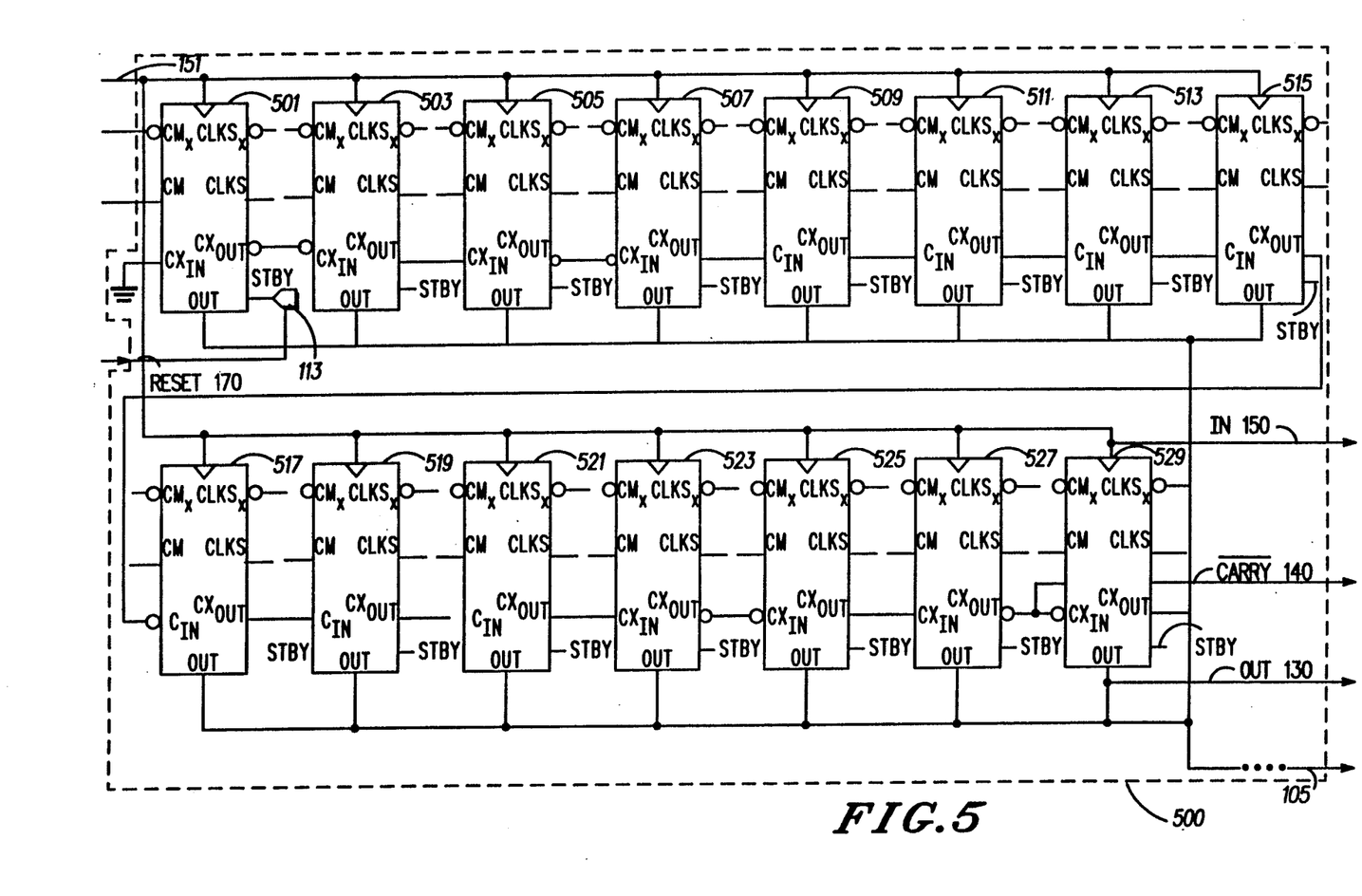
FIG. 5 is a schematic diagram showing the comb filter of FIG. 4.

FIG. 5 is a schematic diagram showing a custom integrated circuit embodiment of the output integrator stage 500 of FIG. 4. The output integrator stage 500 includes a series connection of integrators designated 501, 503, 505, 507 (all 1-bit integrators); 509, 511, 513, 515, 517, 519, 521 (all 4-bit look-ahead integrators); and 523, 525, 527, and 529 (1-bit integrators).

The 31-bit input signal 151 is derived from the output of the previous integrator stage 431 (shown in FIG. 4).

Integrator stage 500 has three outputs. The first output, designated IN (150), is the most-significant bit of the multi-bit input signal 151. This is also the input to the single-bit integrator unit 529. The second output, designated $\overline{\text{CARRY}}$ (140), is the carry-out complement bit from the single-bit integrator unit 529. The third output, designated OUT (130), is the most-significant output bit of the output integrator stage 500. This is also the output from the single-bit integrator unit 529.

For purposes of comparison with FIG. 5, return momentarily to FIG. 4. The first integrator stage 425 and the second integrator stage 431 (as depicted in FIG. 4) may, for example, be similar to the output integrator stage 500 (as depicted in FIG. 5).

Figure 6:
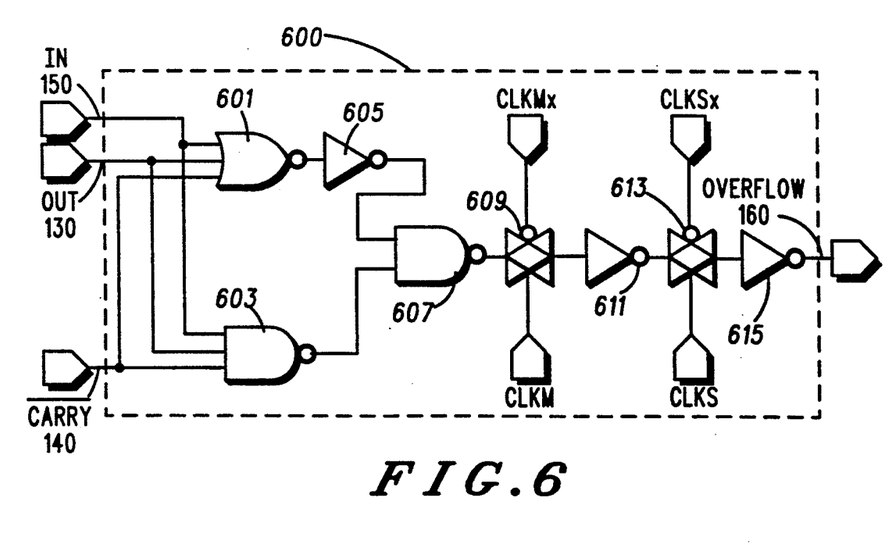
FIG. 6 is a schematic diagram showing an overflow detect circuit suitable for use with a data integrity monitor, according to the invention.

FIG. 6 is a schematic diagram showing a custom integrated circuit embodiment of the overflow detect circuit 600, including a NOR gate 601, a first NAND gate 603, a first inverter 605, a second NAND gate 607, a first transmission gate 609, a second inverter 611, a second transmission gate 613, and a third inverter 615. In the alternative, the circuit 600 may be implemented with the following IC part numbers: MC74HC4075 (3-input OR gate), MC74HC10 (3-input NAND gate), MC74C00A (2-input NAND gate), and MC74HC174 (resettable D-type latch). All parts are available from Motorola.

The circuit 600 includes three inputs: the lead IN (150) with logical value "I", the lead OUT (130) with logical value "O", and the lead $\overline{\text{CARRY}}$ (140) with logical value INVERSE C. These inputs are coupled to the output integrator stage 500. The circuit includes one output, the lead OVERFLOW (160), which is coupled to the reset waveform generator 700.

As discussed above, the function of the overflow detect circuit 600 is to detect an overflow condition in the filter 301 based on the logical values I, O, and INVERSE C and the logical equation above. If an overflow condition exists, the output of element 607 will attain a high logical state, and a triggering signal is applied to the waveform generator circuit 700 via the OVERFLOW output (160).

The function of elements 609, 611, 613, and 615 is to allow the signal from element 607 to pass to the output 160 after any possible transient conditions have passed that otherwise may cause an overflow condition to be falsely detected.

Figure 7:
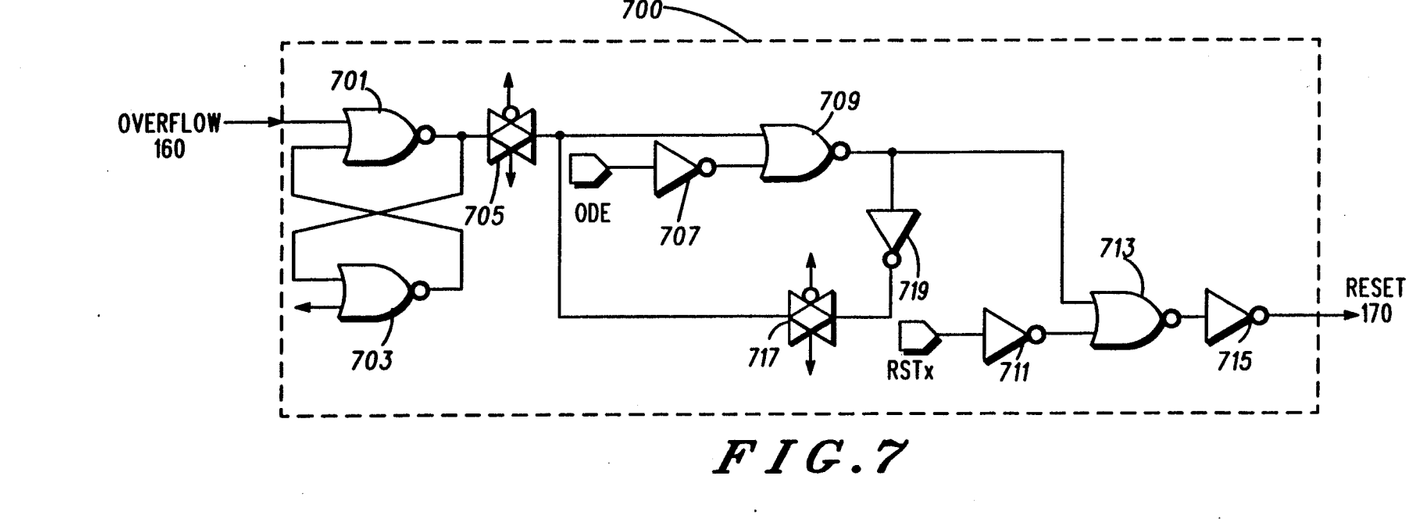
FIG. 7 is a schematic diagram showing a resetting circuit suitable for use with a data integrity monitor, according to the invention.

FIG. 7 is a schematic diagram showing a custom integrated circuit embodiment of the reset waveform generator circuit 700, including NOR gates 701, 703, 709 and 713; inverters 707, 711, 715, and 719; and transmission gates 705 and 717. In the alternative, the circuit 700 may be implemented with the following IC part numbers: MC74HC27 (3-input NOR gate), MC74HC02A (2-input NOR gate), MC74HC04 (inverter), and MC74HC126A (tristable buffer, used for transmission gates). All parts are available from Motorola.

As shown, the circuit includes one input OVERFLOW (160), which is coupled to the output of the overflow detector circuit 600 (shown in FIG. 6). The circuit includes one output RESET (170), which is coupled to the reset terminals of the stages of the filter 301 (shown in FIG. 4).

As discussed above, the function of the reset waveform generator circuit 700 is, upon receiving a triggering OVERFLOW input, to generate a resetting waveform of sufficient shape and duration to reset all the stages in the filter 301.

As shown, the input signal OVERFLOW (160) is applied to gate 701. This latches the overflow signal to the latch formed by the cross-coupled pair of NOR gates 701 and 703. The signal then passes through transmission gate 705 to another latch formed by the transmission gate elements 709, 717, and 719. These elements provide the timing of the width of the reset pulse. The reset pulse is then transmitted to the output RESET (170) via the NOR gate 713 and the inverter 715.

The input designated ODE and coupled to the inverter 707 can be used to override the output, if desired. Also, the input designated RSTx and coupled to the inverter 711 may be used to manually trigger the RESET output 170.

Figure 8:
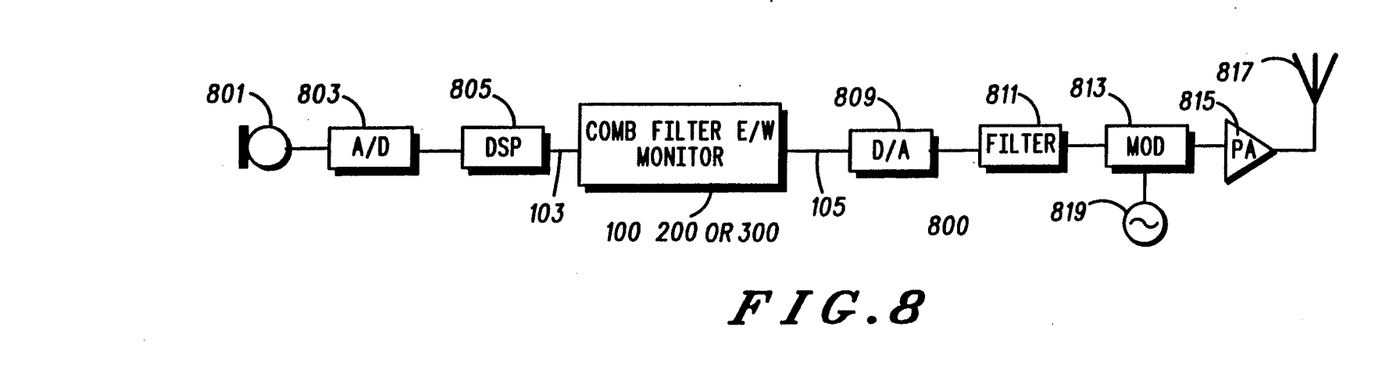
FIG. 8 is a block diagram showing a radio arranged with a data integrity monitor, according to the invention.

FIG. 8 is a block diagram showing a radio 800 arranged with a comb filter equipped with a data integrity monitor, 100, 200, or 300. As shown, the comb filter equipped with the monitor may comprise, for instance, the embodiment 100 depicted in FIG. 1, the embodiment 200 depicted in FIG. 2, or the embodiment 300 depicted in FIG. 3. The radio may be, for example, a frequency-modulated (FM) type, or an amplitude-modulated (AM) type. Other modulation types could be readily supported as well.

As shown, the radio 800 includes a microphone 801, an analog-to-digital converter ("A/D") 803, a digital signal processor (DSP) 805, a comb filter equipped with a data integrity monitor, 100, 200, or 300, a digital-to-analog converter ("D/A") 809, an analog filter 811, a modulator 813, a local oscillator 819, a power amplifier ("PA") 815, and an antenna 817.

A description of the operation of the radio 800 follows. It is assumed the radio is an FM type.

A human voice is applied to the microphone 801, which converts the voice energy to analog electrical signals. The analog electrical signals are applied to the A/D converter 803, which converts them to digital form. The resulting digital signals are then applied to the DSP 805 for further processing. In one embodiment, for instance, the DSP 805 may encode the signals using a predetermined voice-coding algorithm. The output of the DSP 103 is input to the comb filter equipped with a monitor in accordance with the invention, 100, 200, or 300. The output 105 of the comb filter equipped with the monitor is applied to the D/A converter 809, which converts the signal to analog form. The resulting analog signal is then applied to filter 811. The filtered signal is then applied to modulator 813 which, acting with local oscillator 819, frequency-modulates the signal. The resulting signal is then amplified by power amplifier 815, and applied to antenna 817.

In the case of an AM radio, the modulator 815, acting with local oscillator 819, will amplitude-modulate the signal.

As discussed above, during the normal operation of the IIR comb filter 101, 201, 301, the possibility exists for data errors. The source of these errors is primarily noise. Once an error is introduced, ultimately it results in an overflow condition, thus causing the filter to cease operating.

The foregoing problem is even more acute when such a comb filter is used in the transmission path of a typical digital radio. In a digital FM radio, for instance, this problem may occur when an IIR filter is used to interpolate data prior to a final sigma-delta D/A converter used to drive a voltage-controlled oscillator. As discussed, when the filter ultimately overflows, transmission of the desired signal will cease, and the radio will become inoperative.

In a digital AM radio, this problem occurs in the same way as described above for a digital FM radio, with the same undesirable effects.

As disclosed, equipping the comb filter with a data integrity monitor, in accordance with the present invention, solves these problems in an inexpensive and efficient way, by detecting the overflow condition based on the value of the output integrator stage's most-significant input bit, most-significant output bit, and carry complement bit and, thereupon, resetting all filter stages.

As a result of a radio being equipped with such a monitor circuit, the radio will operate more robustly in high-noise or sub-optimal environments, with no user intervention required to restore operation when an overflow condition occurs. The robustness of the radio is improved, since the radio so equipped will function more reliably under adverse conditions.

It must be borne in mind that, even in normal or ideal operating conditions, there will always occur random noise and low-level thermal noise. These noise signals will eventually creep into the system and manifest themselves as errors in the comb filter, ultimately causing the filter to overflow and stop functioning.

By comparison, when adverse radio operating conditions such as, for instance, low battery or power supply, extreme operating ambient temperature (low or high), or high background electromagnetic interference are met, it may be expected that even more noise will be generated, thus eventually resulting in more errors in the comb filter. This will result in overflow conditions occurring more frequently.

Therefore, the advantages of the present invention will be even more apparent in such adverse conditions, due to the comb filter being more susceptible to errors in such a situation.

A real-life example is useful to illustrate the advantage of the present invention. Assume that a typical user of a radio using a comb filter described herein is a policeman. The policeman may use a mobile radio in his patrol car, or a portable hand-held radio. For the reasons outlined above, at some point noise will occur in the comb filter of his radio, which ultimately will cause the filter to overflow and become inoperable. As a result, all radio transmissions will become unintelligible. The policeman would then be forced to return to his central station, inasmuch as his normal duty requires the use of a functioning radio. This means the policeman will need to spend time off-duty in order to return to the station, instead of remaining on-duty, as would be the case if his radio had continued to function. This results in inefficiency and, ultimately, lost taxpayer dollars, since the taxpayers must pay for the policeman's decreased productivity.

It hardly need be noted that, in addition to the lost productivity caused by the policeman being forced to return to his central station to fix his radio, the policeman would be taken "off the beat" for a time, too. This would further present a public safety hazard since, were it not for the troublesome radio filter, the policeman would otherwise be patrolling his beat during that time. This results in impaired police coverage, perhaps even in a high-crime area that demands the full attention of all police officers.

If, however, the radio were equipped with a monitor of the present invention, the filter's overflow condition would immediately be detected, and the filter restored. As a result, the trouble condition would be removed with, at worst, only a momentary loss in transmission, which may even be inaudible to the policeman. Thus, even if the policeman noticed such a minor interruption in transmission, it would not significantly interfere with his duties. As a result, the policeman could remain on patrol with his fully-functioning radio.

Thus, in this example, it is seen that providing such a police radio with a data integrity monitor, in accordance with the present invention, will result not only in increased productivity for the policeman using the radio, but also in lower tax revenues being required to maintain the radio. Moreover, it is likely that the widespread deployment of a large number of such radios in a metropolitan area would result in a substantial savings of public revenues to the taxpayers, together with the citizens enjoying a corresponding substantial increase in public safety and enhanced law enforcement.

While various embodiments of a data integrity monitor, according to the present invention, have been described hereinabove, the scope of the invention is defined by the following claims.

What is claimed is:

1. An arrangement comprising a comb filter coupled to a monitor, the comb filter including an input and an output, the comb filter further including:
   at least one differencer stage,
   at least one buffer stage,
   at least one integrator stage,
   the input coupled to the at least one differencer stage,
   the at least one differencer stage, the at least one buffer stage, and the at least one integrator stage connected in series to form a series of stages terminating in an output integrator stage,
   each stage including a resetting terminal for resetting the stage,
   the output integrator stage coupled to the output and comprising a multi-bit input signal including a most-significant input bit, a multi-bit output signal including a most-significant output bit, and a carry bit,
   the monitor including detecting means for detecting an overflow condition based on values of the output integrator stage's most-significant input bit, most-significant output bit, and carry bit, and further including resetting waveform means for, in response to the occurrence of an overflow condition, generating a resetting waveform and coupling the resetting waveform to the resetting terminal of the at least one differencer stage, the at least one buffer stage, and the at least one integrator stage, including the output integrator stage.

2. The arrangement of claim 1, where the detecting means is arranged for detecting the overflow condition based on the following logical equation:

$$\text{(inverse C)}^*(O)^*(I) + (C)^*\text{(inverse O)}^*\text{(inverse I)},$$

where:
   "I" = the value of the output integrator stage's most-significant input bit,
   "O" = the value of the output integrator stage's most-significant output bit, and
   "C" = the value of the output integrator stage's carry bit.

3. The arrangement of claim 1, where the resetting waveform is characterized by a predetermined shape and time duration.

4. The arrangement of claim 1, the comb filter having an infinite impulse response, and having 3 differencer stages, 1 buffer stage, and 3 integrator stages.

5. The arrangement of claim 1, the monitor being fabricated at least in part in a custom integrated circuit.

6. The arrangement of claim 1, the monitor being fabricated at least in part in a digital signal processor.

7. A comb filter, the comb filter including an input and an output, the comb filter further including:
   at least one differencer stage,
   at least one buffer stage,
   at least one integrator stage,
   the input coupled to the at least one differencer stage,
   the at least one differencer stage, the at least one buffer stage, and the at least one integrator stage connected in series to form a series of stages terminating in an output integrator stage,
   each stage including a resetting terminal for resetting the stage,
   the output integrator stage coupled to the output and comprising a multi-bit input signal including a most-significant input bit, a multi-bit output signal including a most-significant output bit, and a carry bit,
   a monitor including detecting means for detecting an overflow condition based on values of the output integrator stage's most-significant input bit, most-significant output bit, and carry bit, and further including resetting waveform means for, in response to the occurrence of an overflow condition, generating a resetting waveform and coupling the resetting waveform to the resetting terminal of the at least one differencer stage, the at least one buffer stage, and the at least one integrator stage, including the output integrator stage.

8. The comb filter of claim 7, where the detecting means is arranged for detecting the overflow condition based on the following logical equation:

$$\text{(inverse C)}^*(O)^*(I) + (C)^*\text{(inverse O)}^*\text{(inverse I)},$$

where:
   "I" = the value of the output integrator stage's most-significant input bit,
   "O" = the value of the output integrator stage's most-significant output bit, and
   "C" = the value of the output integrator stage's carry bit.

9. The comb filter of claim 7, where the resetting waveform is characterized by a predetermined shape and time duration.

10. The comb filter of claim 7, the comb filter having an infinite impulse response, and having 3 differencer stages, 1 buffer stage, and 3 integrator stages.

11. The comb filter of claim 7, the monitor being fabricated at least in part in a custom integrated circuit.

12. The comb filter of claim 7, the monitor being fabricated at least in part in a digital signal processor.

13. An arrangement comprising a comb filter coupled to a resetting circuit, the comb filter including an input and an output, the comb filter further including:
   at least one differencer stage,
   at least one buffer stage,
   at least one integrator stage,
   the input coupled to the at least one differencer stage,
   the at least one differencer stage, the at least one buffer stage, and the at least one integrator stage connected in series to form a series of stages terminating in an output integrator stage,
   each stage including a resetting terminal for resetting the stage,
   the output integrator stage coupled to the output and comprising a multi-bit input signal including a most-significant input bit, a multi-bit output signal including a most-significant output bit, and a carry bit, an overflow detect circuit including detecting means for detecting an overflow condition based on values of the output integrator stage's most-significant input bit, most-significant output bit, and carry bit;

the resetting circuit including resetting waveform means for, in response to the occurrence of an overflow condition, generating a resetting waveform and coupling the resetting waveform to the resetting terminal of the at least one differencer stage, the at least one buffer stage, and the at least one integrator stage, including the output integrator stage.

14. The arrangement of claim 13, where the detecting means is arranged for detecting the overflow condition based on the following logical equation:

$$(\text{inverse } C)*(O)*(I)+(C)*(\text{inverse } O)*(\text{inverse } I),$$

where:
"I"=the value of the output integrator stage's most-significant input bit,
"O"=the value of the output integrator stage's most-significant output bit, and
"C"=the value of the output integrator stage's carry bit.

15. The arrangement of claim 13, where the resetting waveform is characterized by a predetermined shape and time duration.

16. The arrangement of claim 13, the comb filter having an infinite impulse response, and having 3 differencer stages, 1 buffer stage, and 3 integrator stages.

17. The arrangement of claim 13, the overflow detect circuit being fabricated at least in part in a custom integrated circuit.

18. The arrangement of claim 13, the resetting circuit being fabricated at least in part in a custom integrated circuit.

19. A radio including an arrangement comprising a comb filter coupled to a monitor, the comb filter including an input and an output, the comb filter further including:
at least one differencer stage,
at least one buffer stage,
at least one integrator stage,
the input coupled to the at least one differencer stage,
the at least one differencer stage, the at least one buffer stage, and the at least one integrator stage connected in series to form a series of stages terminating in an output integrator stage,
each stage including a resetting terminal for resetting the stage,
the output integrator stage coupled to the output and comprising a multi-bit input signal including a most-significant input bit, a multi-bit output signal including a most-significant output bit, and a carry bit,
the monitor including detecting means for detecting an overflow condition based on values of the output integrator stage's most-significant input bit, most-significant output bit, and carry bit, and further including resetting waveform means for, in response to the occurrence of an overflow condition, generating a resetting waveform and coupling the resetting waveform to the resetting terminal of the at least one differencer stage, the at least one buffer stage, and the at least one integrator stage, including the output integrator stage.

20. The radio of claim 19, where the detecting means is arranged for detecting the overflow condition based on the following logical equation:

$$(\text{inverse } C)*(O)*(I)+(C)*(\text{inverse } O)*(\text{inverse } I),$$

where:
"I"=the value of the output integrator stage's most-significant input bit,
"O"=the value of the output integrator stage's most-significant output bit, and
"C"=the value of the output integrator stage's carry bit.

21. The radio of claim 19, where the resetting waveform is characterized by a predetermined shape and time duration.

22. The radio of claim 19, the comb filter having an infinite impulse response, and having 3 differencer stages, 1 buffer stage, and 3 integrator stages.

23. The radio of claim 19, the monitor being fabricated at least in part in a custom integrated circuit.

24. The radio of claim 19, the monitor being fabricated at least in part in a digital signal processor.

25. A radio including a comb filter, the comb filter including an input and an output, the comb filter further including:
at least one differencer stage,
at least one buffer stage,
at least one integrator stage,
the input coupled to the at least one differencer stage,
the at least one differencer stage, the at least one buffer stage, and the at least one integrator stage connected in series to form a series of stages terminating in an output integrator stage,
each stage including a resetting terminal for resetting the stage,
the output integrator stage coupled to the output and comprising a multi-bit input signal including a most-significant input bit, a multi-bit output signal including a most-significant output bit, and a carry bit,
a monitor including detecting means for detecting an overflow condition based on values of the output integrator stage's most-significant input bit, most-significant output bit, and carry bit, and further including resetting waveform means for, in response to the occurrence of an overflow condition, generating a resetting waveform and coupling the resetting waveform to the resetting terminal of the at least one differencer stage, the at least one buffer stage, and the at least one integrator stage, including the output integrator stage.

26. The radio of claim 25, where the detecting means is arranged for detecting the overflow condition based on the following logical equation:

$$(\text{inverse } C)*(O)*(I)+(C)*(\text{inverse } O)*(\text{inverse } I),$$

where:
"I"=the value of the output integrator stage's most-significant input bit,
"O"=the value of the output integrator stage's most-significant output bit, and
"C"=the value of the output integrator stage's carry bit.

27. The radio of claim 25, where the resetting waveform is characterized by a predetermined shape and time duration.

28. The radio of claim 25, having an infinite impulse response, and having 3 differencer stages, 1 buffer stage, and 3 integrator stages.

29. The radio of claim 25, the monitor being fabricated at least in part in a custom integrated circuit.

30. The radio of claim 25, the monitor being fabricated at least in part in a digital signal processor.

31. A radio including an arrangement comprising a comb filter coupled to a resetting circuit, the comb filter including an input and an output, the comb filter further including:

at least one differencer stage,
at least one buffer stage,
at least one integrator stage,
the input coupled to the at least one differencer stage,
the at least one differencer stage, the at least one buffer stage, and the at least one integrator stage connected in series to form a series of stages terminating in an output integrator stage,
each stage including a resetting terminal for resetting the stage,
the output integrator stage coupled to the output and comprising a multi-bit input signal including a most-significant input bit, a multi-bit output signal including a most-significant output bit, and a carry bit,
an overflow detect circuit including detecting means for detecting an overflow condition based on values of the output integrator stage's most-significant input bit, most-significant output bit, and carry bit;
the resetting circuit including resetting waveform means for, in response to the occurrence of an overflow condition, generating a resetting waveform and coupling the resetting waveform to the resetting terminal of the at least one differencer stage, the at least one buffer stage, and the at least one integrator stage, including the output integrator stage.

32. The radio of claim 31, where the detecting means is arranged for detecting the overflow condition based on the following logical equation:

$$(\text{inverse } C)*(O)*(I) + (C)*(\text{inverse } O)*(\text{inverse } I),$$

where:
"I" = the value of the output integrator stage's most-significant input bit,
"O" = the value of the output integrator stage's most-significant output bit, and
"C" = the value of the output integrator stage's carry bit.

33. The radio of claim 31, where the resetting waveform is characterized by a predetermined shape and time duration.

34. The radio of claim 31, the comb filter having an infinite impulse response, and having 3 differencer stages, 1 buffer stage, and 3 integrator stages.

35. The radio of claim 31, the overflow detect circuit being fabricated at least in part in a custom integrated circuit.

36. The radio of claim 31, the resetting circuit being fabricated at least in part in a custom integrated circuit.

* * * * *